(12) United States Patent
Son

(10) Patent No.: US 8,841,759 B2
(45) Date of Patent: Sep. 23, 2014

(54) SEMICONDUCTOR PACKAGE AND MANUFACTURING METHOD THEREOF

(75) Inventor: Kyung Joo Son, Ansan-si (KR)

(73) Assignee: LG Innotek Co., Ltd., Seoul (KR)

( * ) Notice: Subject to any disclaimer, the term of this patent is extended or adjusted under 35 U.S.C. 154(b) by 382 days.

(21) Appl. No.: 12/439,257

(22) PCT Filed: Dec. 18, 2007

(86) PCT No.: PCT/KR2007/006620
§ 371 (c)(1),
(2), (4) Date: Feb. 27, 2009

(87) PCT Pub. No.: WO2008/078899
PCT Pub. Date: Jul. 3, 2008

(65) Prior Publication Data
US 2009/0321911 A1 Dec. 31, 2009

(30) Foreign Application Priority Data

Dec. 23, 2006 (KR) .................... 10-2006-0133279
Jan. 30, 2007 (KR) .................... 10-2007-0009661

(51) Int. Cl.
*H01L 23/02* (2006.01)
*H01L 23/498* (2006.01)
*H01L 25/10* (2006.01)
*H01L 23/31* (2006.01)
*H01L 21/56* (2006.01)
*H01L 23/00* (2006.01)

(52) U.S. Cl.
CPC ...... *H01L 23/3121* (2013.01); *H01L 23/49827* (2013.01); *H01L 2225/1023* (2013.01); *H01L 238/3677* (2013.01); *H01L 2924/01029* (2013.01); *H01L 2924/14* (2013.01); *H01L 2924/19041* (2013.01); *H01L 2924/3025* (2013.01); *H01L 2924/09701* (2013.01); *H01L 25/105* (2013.01); *H01L 2924/01027* (2013.01); *H01L 2225/1064* (2013.01); *H01L 24/48* (2013.01); *H01L 24/97* (2013.01); *H01L 2224/32225* (2013.01); *H01L 2924/01075* (2013.01); *H01L 2224/48227* (2013.01); *H01L 2224/97* (2013.01); *H01L 2225/1005* (2013.01); *H01L 2924/01079* (2013.01); *H01L 2225/1094* (2013.01); *H01L 2224/73265* (2013.01); *H01L 21/561* (2013.01); *H01L 2924/01078* (2013.01)
USPC .................. 257/686; 257/690; 257/E25.027; 438/109

(58) Field of Classification Search
USPC .................. 257/686, 690, E25.027, E23.169, 257/E23.172; 438/107, 109
See application file for complete search history.

(56) References Cited

U.S. PATENT DOCUMENTS 5,694,300 A * 12/1997 Mattei et al. .................. 361/818
6,181,560 B1  1/2001 Kim
(Continued)

FOREIGN PATENT DOCUMENTS

KR  10-2005-0083630 A  8/2005

OTHER PUBLICATIONS

Office Action dated Sep. 16, 2013 in Korean Application No. 10-2007-0009661, filed Jan. 30, 2007.

*Primary Examiner* — Tom Thomas
*Assistant Examiner* — Christopher M Roland
(74) *Attorney, Agent, or Firm* — Saliwanchik, Lloyd & Eisenschenk

(57) ABSTRACT

Provided are a semiconductor package and a manufacturing method thereof. A semiconductor package according to an embodiment comprises a chip part on a board, a mold member, and a plated layer on the mold member. The plated layer comprises an electrode pattern connected to a pattern of the board. The electrode pattern of the plated layer can be mounted at least one of at least one a chip part and at least one another semiconductor package.

8 Claims, 4 Drawing Sheets

(56) References Cited

U.S. PATENT DOCUMENTS

| | | |
|---|---|---|
| 6,400,014 B1 | 6/2002 | Huang |
| 6,717,253 B2 | 4/2004 | Yang |
| 7,663,215 B2 | 2/2010 | Tuominen et al. |
| 2004/0178495 A1* | 9/2004 | Yean et al. .................. 257/723 |
| 2005/0013082 A1* | 1/2005 | Kawamoto et al. ........... 361/118 |
| 2005/0023658 A1 | 2/2005 | Tabira |
| 2005/0269696 A1* | 12/2005 | Ochiai ........................ 257/734 |
| 2006/0076667 A1* | 4/2006 | Bachmaier et al. ........... 257/689 |
| 2007/0096291 A1* | 5/2007 | Kawabata et al. ............ 257/700 |
| 2007/0241437 A1* | 10/2007 | Kagaya et al. ................ 257/678 |
| 2007/0262436 A1* | 11/2007 | Kweon et al. ................ 257/686 |
| 2007/0267136 A1 | 11/2007 | Tuominen et al. |
| 2011/0115066 A1* | 5/2011 | Kim et al. .................... 257/690 |

\* cited by examiner

SEMICONDUCTOR PACKAGE AND MANUFACTURING METHOD THEREOF

CROSS-REFERENCE TO RELATED APPLICATION

This application is the U.S. national stage application of International Patent Application No. PCT/KR2007/006620, filed Dec. 18, 2007, the disclosure of which is hereby incorporated by reference in its entirety.

TECHNICAL FIELD

The embodiment relates to a semiconductor package and a manufacturing method thereof.

BACKGROUND ART

With recent trends of multi-function and miniaturization in wireless communication terminals such as personal digital assistants (PDAs), smart phones, digital multimedia broadcasting (DMB) terminals, various parts mounted within these terminals are developed in a small size.

Also, demands for parts of a cellular phone rapidly increase in a market for electronic products, and the parts of the cellular phone are developed in a lightweight and slim profile.

To realize a lightweight and slim profile and miniaturization in these parts, technology for reducing individual sizes of mounted parts, system on chip (SoC) technology for making a plurality of individual devices in the form of one chip, and system in package (SIP) technology for integrating a plurality of individual devices in the form of one package are required. That is, research for realizing various parts mounted within a terminal or passive devices, active devices, and high frequency filter chips mounted within a handset apparatus cooperating with the terminal in the form of one package are under development.

DISCLOSURE OF INVENTION

Technical Problem

Embodiments provide a semiconductor package comprising a circuit pattern thereon and a manufacturing method thereof.

Embodiments provide a semiconductor package allowing a semiconductor package comprising a circuit pattern thereon to mount other semiconductor package or a chip part on the semiconductor package, and a manufacturing method thereof.

Technical Solution

An embodiment provides a semiconductor package, comprising: a chip part on a board; a mold member protecting the chip part; a plated layer comprising an electrode pattern connected to a pattern of the board on the mold member.

An embodiment provides a semiconductor package, comprising: a first chip part on a first semiconductor package, a first mold member protecting the first chip part, a first plated layer comprising an electrode pattern connected to a pattern of the first board on the mold member; and a second semiconductor package on the electrode pattern of the first semiconductor package.

An embodiment provides a method for manufacturing a semiconductor package, comprising: mounting a chip part on a board; forming a mold member on the chip part of the board; etching the mold member and a portion of the board to expose a wiring pattern of the board; forming a plated layer on the mold member and the exposed portion of the board; and forming an electrode pattern on the plated layer.

The details of one or more embodiments are set forth in the accompanying drawings and the description below. Other features will be apparent from the description and drawings, and from the claims.

Advantageous Effects

A semiconductor package and a manufacturing method thereof according to an embodiment can mount another package or a part on the semiconductor package, thereby realizing an ultra-miniature package assembly.

Also, a product to which a stacked type semiconductor package has been applied can be ultra-miniaturized and integrated in high density, so that a space can be efficiently secured.

BEST MODE FOR CARRYING OUT THE INVENTION

Reference will now be made in detail to the embodiments, examples of which are illustrated in the accompanying drawings. It will be understood that when an element is referred to as being 'on' or 'under' another element, it can be directly on/under the element, and one or more intervening elements may also be present.

Figure 1:
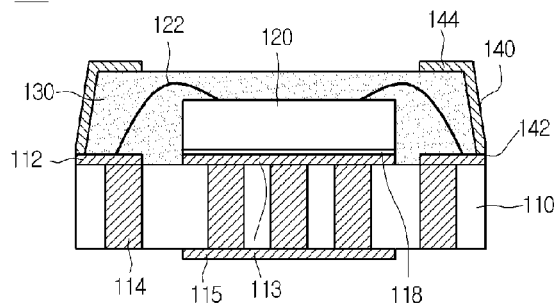
FIG. 1 is a cross-sectional view of a semiconductor package according to a first embodiment.

FIG. 1 is a cross-sectional view of a semiconductor package according to the first embodiment.

Referring to FIG. 1, the semiconductor package 100 comprises a board 110, a chip part 120, a mold member 130, and a plated layer 140.

The board 110 comprise a ceramic substrate such as a high temperature co-fired ceramic (HTCC) and a low temperature co-fired ceramic (LTCC), and a printed circuit board (PCB). A wiring pattern 112, a via hole 114, a through hole, and a ground portion designed in advance are formed on the board 110.

The chip part 120 can comprise a part that can be mounted on the board 110. For example, the chip part 120 can comprise a circuit device such as a multi layer ceramic capacitor (MLCC), a chip inductor, a chip resistor, a chip switch, and a diode, various filters, an integrated circuit, a printed resistor or a thin film condenser, an inductor, and a flash memory.

The chip part 120 can be mounted on the board 110 through a surface mount technology (SMT). The number of mounted parts can change depending on a circuit or a function of a high frequency module. Also, the chip part 120 can be selectively mounted using flip bonding, wire bonding, or die bonding as a method for electrically connecting the chip part 120 to a wiring pattern.

Also, the chip part 120 such as a bare die can be attached on a fixing pattern 113 or a board insulating layer through die attaching using an adhesive 118, and can be bonded on the wiring pattern 112 using a wire 122. The fixing pattern 113 allows heat to be efficiently sunk through a heatsink pattern 115 of a bottom layer connected to the via hole 114. Here, a term for the fixing pattern 113 or the heatsink pattern 115 can be changed with a technical scope thereof, and is not limited thereto.

The mold member 130 protects the chip part 120. The mold member 130 can have a height equal to or greater than the thickness of the chip part 120 or the height of the wire 122. The mold member 130 can be formed of one of epoxy molding compound, poly phenylene oxide, epoxy sheet molding (ESM), and silicon.

The plated layer 140 is a surface conductive layer and formed on the surface of the mold member 130. An electrode pattern 144 is formed on a portion or an entire region of the plated layer 140 formed on the mold member 130. The electrode pattern 144 is formed on the upper surface and the lateral sides of the plated layer 140 in the form of a predetermined circuit pattern.

One end 142 of the plated layer 140 is electrically connected to the wiring pattern 112 of the board 110. Also, the plated layer 140 is connected to the board 110 along the lateral sides of the mold member 130, or connected to the board 110 by passing through the mold member 130.

At least one chip part (not shown) can be mounted on the electrode pattern 144 of the plated layer 140 formed on the mold member 130. The chip part (not shown) can be connected to the wiring pattern 112 or the via hole 114 of the board 110 through the plated layer 140, and can be connected to an external terminal through the via hole 114 and a terminal of the bottom layer.

Since electrical connection to the outside can be made through the plated layer 140 of the semiconductor package 100, elements inside the package and elements outside the package can be separated and packaged separately.

FIGS. 2 to 7 are views illustrating a process of manufacturing a semiconductor package according the first embodiment.

Figure 2:
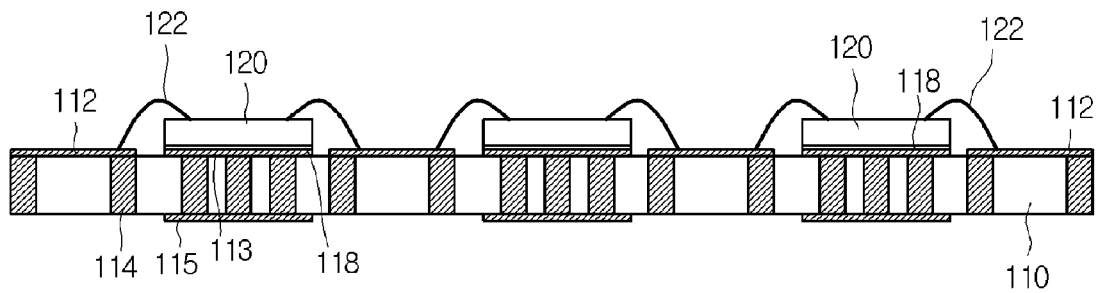
FIGS. 2 to 7 are views illustrating a process of manufacturing a semiconductor package according the first embodiment.

Referring to FIG. 2, for a process of mounting the chip part 120 onto the board 110, the chip part 120 such as a bare die is bonded on the fixing pattern 113 of the board 110 using an adhesive 118 through die attaching, and connected to the wiring pattern 112 using a wire 122. Here, the chip part 120 is bonded using SMT, or mounted using a ball grid array (BGA) method or flip bonding depending on the characteristic or the kind of the chip part 120. Embodiments are not limited to the above-described kind of chip part or bonding method. Also, the wiring pattern 112 of the board 110 can be selectively connected to other layer or the bottom layer through the via hole 114, the through hole, and the via.

Figure 3:
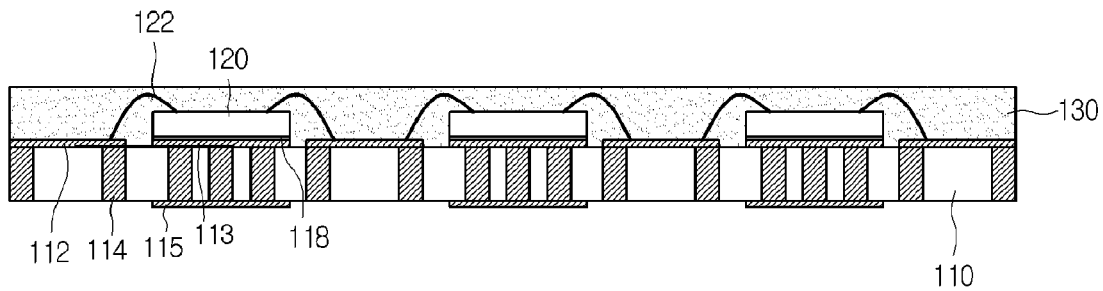

Referring to FIG. 3, the mold member 130 is formed on the board 110. The mold member 130 is formed up to the thickness or more of the chip part 120, or the height or more of the wire 122 to protect the chip part 120. The mold member 130 can be formed using, for example, transfer molding using an epoxy mold compound, a molding method of thermally pressurizing an epoxy sheet, a method of discharging a liquid molding material and performing heat treatment, and injection molding. Here, in the case of using the transfer molding, the mold member 130 can be formed on a chip part region or an entire board.

Figure 4:
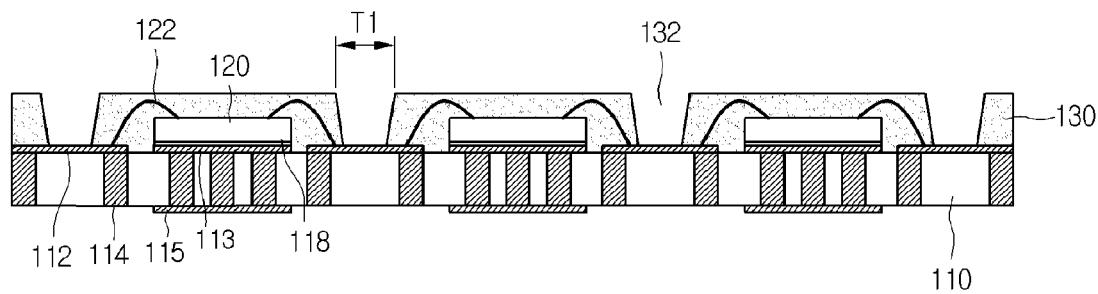

Referring to FIG. 4, a package boundary region T1 of the mold member 130 is cut to expose a portion of the wiring pattern 112 of the board 110. That is, a portion of the mold member 130 corresponding to the region T1 excluding a unit package size is cut through a half cutting process, and a hole 132 is formed.

During a process of forming the hole 132 in the mold member 130, the surface of the mold member 130 and a portion of the board 110 are processed using a laser or the blade of knife to form the hole 132 corresponding to the package boundary region T1. This hole forming process is a process of exposing the pattern of the board 110. The hole forming process can expose a pattern of a top layer of the board, or a predetermined layer inside the board.

Figure 5:
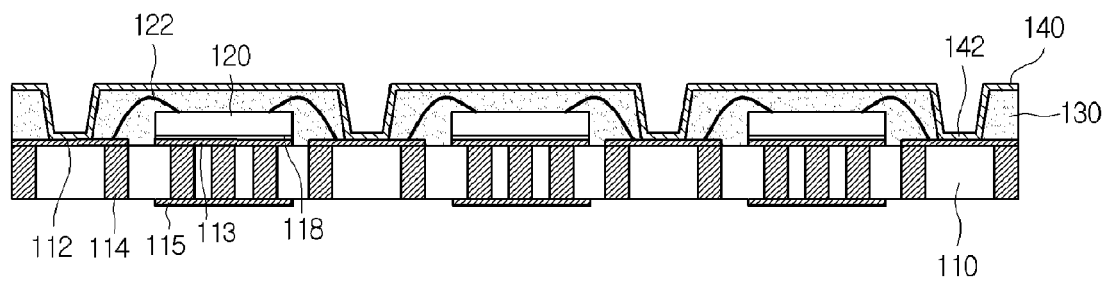

Referring to FIG. 5, the plated layer 140 is formed on the surface of the mold member 130, and the surface of the exposed portion of the board 110. Here, the plated layer 140 can be formed using one of sputtering, evaporating, electroplating, and electroless plating.

Also, the plated layer 140 can be formed of one or more layers using a conductive material with consideration of a bonding characteristic with the mold member 130 and solidity of a plated body. For example, the plated layer 140 can be formed by stacking one or more layers on the surface of the mold member 130 using Cu, Ti, Ni, and Au, a conductive material, or a combination thereof. At this point, the plated layer 140 can be stacked on the surface of the mold member 130 in a sequence of Cu layer/Ni layer/Au layer.

One end 142 of the plated layer 140 is electrically connected to the wiring pattern 112 of the board 110. For another example, after a hole vertically passing through from the mold member 130 to the surface of the board is formed, the plated layer 140 can be electrically connected to the wiring pattern of the board by filling the hole with the plated layer 140.

Figure 6:
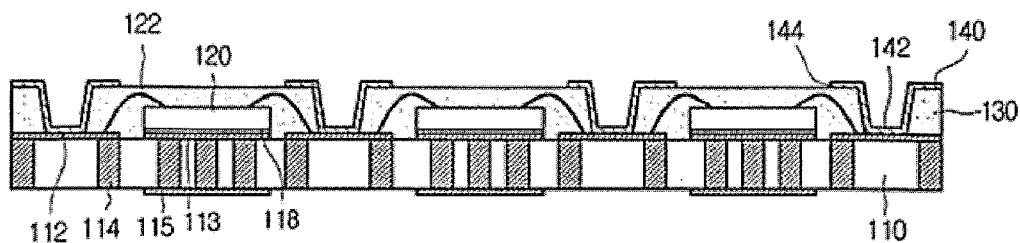

Referring to FIG. 6, a predetermined electrode pattern 144 is formed on the plated layer 140. A desired electrode pattern 144 can be formed on the plated layer 140 through photolithography. The electrode pattern 144 can be connected to the wiring pattern 112 of the board 110 through a vertical pin structure.

Figure 7:
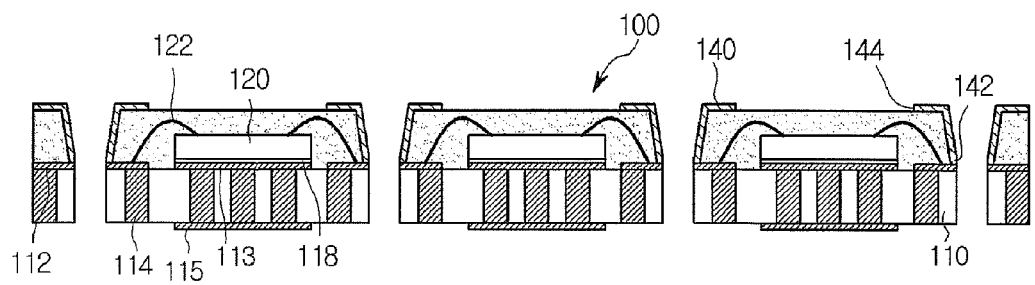

Referring to FIG. 7, the board 110 is fully cut to a unit package size, so that a semiconductor package 100 illustrated in FIG. 1 is completed.

Figure 8:
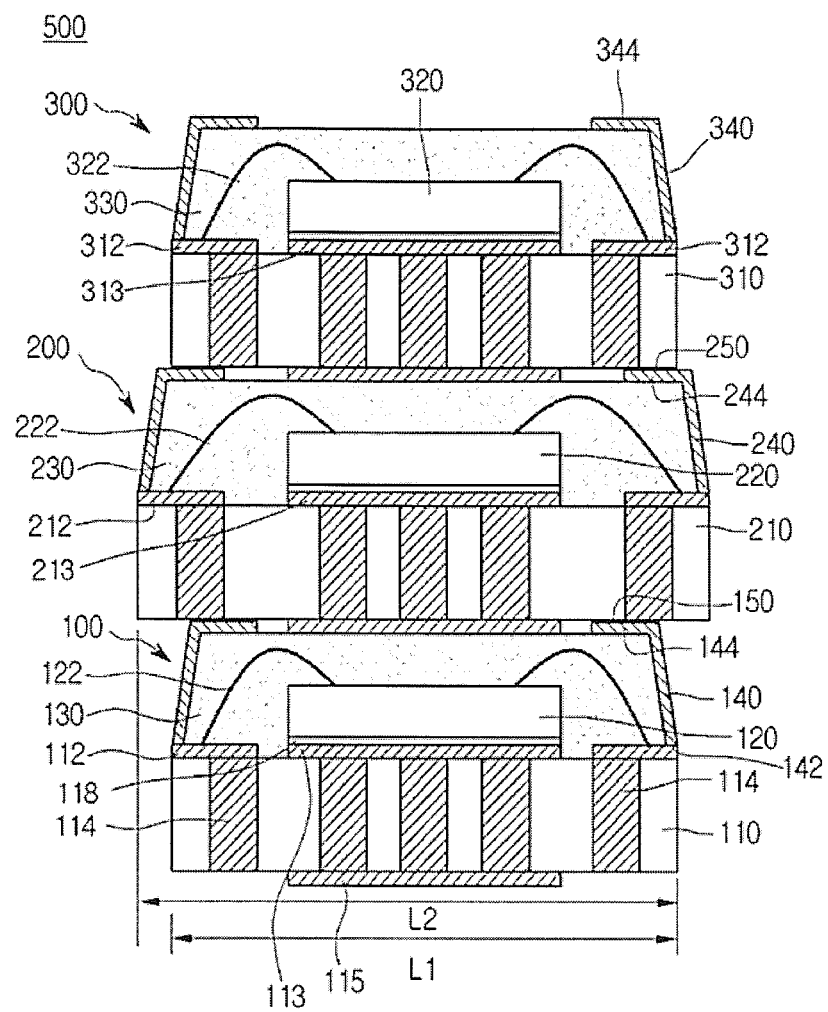
FIG. 8 is a cross-sectional view of a semiconductor package according to a second embodiment.

FIG. 8 is a cross-sectional view of a stacked type semiconductor package according to a second embodiment. Descriptions of the same elements as those of the first embodiment are omitted in describing the second embodiment.

Referring to FIG. 8, the stacked type semiconductor package 500 comprises independent semiconductor packages 100, 200, and 300 mounted in a stacked structure. That is, the second semiconductor package 200 is stacked on the first semiconductor package 100, so that they are electrically connected to each other. The third semiconductor package 300 is stacked on the second semiconductor package 200, so that they are electrically connected to each other. All the semiconductor packages 100, 200, and 300 can be connected to each other, or the semiconductor packages are selectively connected in this manner.

In the semiconductor packages 100, 200, and 300, chip parts 120, 220, and 320 of the same kind or different kinds are bonded on fixing patterns 113, 213, and 313 of the boards using an adhesive, and connected to the wiring patterns 112, 212, and 312 using wires 122, 222, and 322.

Also, the sizes of the semiconductor packages 100, 200, and 300 can be equal to or different from one another. For example, the size L1 of the first semiconductor package 100 can be smaller or greater than the size L2 of the second semiconductor package 200. Also, the size of the second semiconductor package 200 can be 30-50% smaller or greater than that of the first semiconductor package 100. The size of the semiconductor package may be varied depending on a circuit connection structure.

The semiconductor packages 100, 200, and 300 comprise mold members 130, 230, and 330 to protect the chip parts 120, 220, and 320, respectively. Plated layers 140, 240, and 340 are formed on the surfaces of the mold members 130, 230, and 330, respectively. At this point, electrode patterns 144, 244, and 344 are formed on the plated layers 140, 240, and 340, respectively.

A terminal (not shown) formed on a bottom layer of a board 210 of the second semiconductor package 200 is bonded on the electrode pattern 144 of the plated layer 140 of the first semiconductor package 100 using solder 150 through SMT. Also, a terminal (not shown) formed on a bottom layer of a board 310 of the third semiconductor package 300 is bonded on the electrode pattern 244 of the plated layer 240 of the second semiconductor package 200 using solder 250 through SMT.

Here, an electrode pattern 344 formed on the plated layer 340 of the third semiconductor package 300 is electrically connected to an electrode pattern 244 of the plated layer 240 of the second semiconductor package 200 through a bottom layer of a third board 310. An electrode pattern 244 formed on the plated layer 240 of the second semiconductor package 200 is electrically connected to an electrode pattern 144 of the plated layer 140 of the first semiconductor package 100 through a bottom layer of the second board 210. Accordingly, a signal line of the third chip part 320 of the third semiconductor package 300 is connected to the second semiconductor package 200. The second semiconductor package 200 connects the signal line of the third chip part 320 and a signal line of the second chip part 220 to the first semiconductor package 100. The first semiconductor package 100 connects the signal lines of the third chip part 320, the second chip part 220, and the first chip part 120 to an external board through a signal terminal of the bottom layer of the first board 110.

Here, only the plated layer where an electrode pattern 344 is not formed can be formed on the third semiconductor package 300 stacked last in the stacked type semiconductor package 500.

Figure 9:
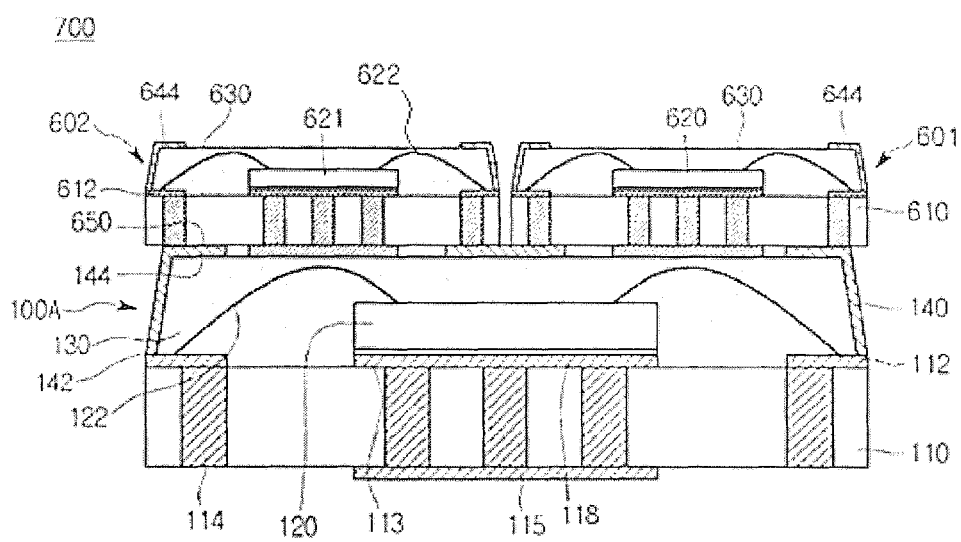
FIG. 9 is a cross-sectional view of a semiconductor package according to a third embodiment.

FIG. 9 is a cross-sectional view of a stacked type semiconductor package according to a third embodiment. Descriptions of the same elements as those of the first embodiment are omitted in describing the third embodiment.

Referring to FIG. 9, the stacked type semiconductor package 700 has a structure in which a plurality of semiconductor packages 601 and 602 are stacked on a first semiconductor package 100A. The second semiconductor package 601 and the third semiconductor package 602 are mounted on one side and the other side in a horizontal direction on an electrode pattern 144 of a plated layer 140 of the first semiconductor package 100A. The second and third semiconductor packages 601 and 602 can be bonded on the electrode pattern 144 of the plated layer 140 of the first semiconductor package 100 using solder 650 through SMT. Accordingly, chip parts 620 and 621 of the second and third semiconductor packages 601 and 602 are connected to the electrode pattern 144 of the plated layer 140 of the first semiconductor package 100A through a wire 622 connected to a wiring pattern 612 of a board 610, so that the chip parts 620 and 621 can be connected up to a bottom layer of a first board 110 in an aspect of circuit.

Here, the second and third semiconductor packages 601 and 602 can have the same thickness or different thicknesses, respectively. In the second and third semiconductor packages 601 and 602, an electrode pattern may not be formed on portions of a plated layer 644 formed on a mold member 630 corresponding to the two packages, or may be formed on only one package. At this point, the plated layer on which the electrode pattern has not been formed is connected to a ground of a board of the first semiconductor package, so that the plated layer can be used as an electromagnetic wave shielding structure.

These embodiments can realize a stacked type semiconductor package in an ultra-slim profile using a package-on-method, so that the stacked type semiconductor package can be applied to various kinds of packages such as a multi chip package (MCP) and a system in package (SIP). Also, the stacked type semiconductor package can be provided in a package structure that can secure a space in an apparatus such as cellular phones and headsets.

Although the embodiments are described, this is illustrative purpose, and the present invention is not limited thereto. It should be understood that numerous other modifications and embodiments can be devised by those skilled in the art that will fall within the spirit and scope of the principles of this disclosure.

INDUSTRIAL APPLICABILITY

A semiconductor package and a manufacturing method thereof according to the embodiment mount other package or parts on the semiconductor package to realize an ultra-miniature package assembly.

Also, since a product applying a stacked type semiconductor package can be ultra-miniaturized and integrated in high density, space is efficiently secured inside the product.

The invention claimed is:
1. A semiconductor package comprising:
a first semiconductor package comprising a first chip part on a first board, a first mold member covering the first chip part on the first board, a first wiring pattern at a lower surface of the first mold member, a first wire connecting the first wiring pattern to the first chip part, a first via hole through the first board, and a first plated layer comprising a first electrode pattern connected to the first wiring pattern of the first board on the first mold member; and
a second semiconductor package comprising a second chip part on a second board, a second mold member covering the second chip part on the second board, a second wiring pattern at a lower surface of the second mold member, a second wire connecting the second wiring pattern to the second chip part, a second via hole through the second board, and a second plated layer comprising a second electrode pattern connected to the second wiring pattern of the second board on the second mold member;
wherein the second semiconductor package is disposed on the first semiconductor package,
wherein the first electrode pattern is disposed at an upper surface of the first mold member,
wherein the first plated layer is disposed at the upper surface and a side surface of the first mold member,
wherein the first mold member is formed by a molding method,
wherein the first mold member covers the first wire,
wherein the first wire is disposed in the first mold member,
wherein the first plated layer is disposed at an outer surface of the first mold member,
wherein the first plated layer is connected with the first wiring pattern which is connected with the first via hole, wherein a portion of an upper surface of the first plated layer is exposed to be connected with a second via hole of the second semiconductor package, wherein one end of the second via hole is directly connected with the first electrode pattern, and wherein another end of the second via hole is directly connected with one end of the second wiring pattern.

2. The semiconductor package according to claim 1, wherein the second semiconductor package comprises a plurality of semiconductor packages on one side and another side on the first semiconductor package.

3. The semiconductor package according to claim 1, comprising at least one third semiconductor package on an electrode pattern of the second semiconductor package.

4. The semiconductor package according to claim 1, wherein the second plated layer is connected to a ground portion of the second board.

5. The semiconductor package according to claim 1, wherein the second semiconductor package comprises a second chip parts of the same kind or different kinds compared with the first semiconductor package.

6. The semiconductor package according to claim 1, wherein the first semiconductor package and the second semiconductor package are the same or different from each other in their sizes.

7. The semiconductor package according to claim 1, wherein the electrode pattern of the first plated layer of the first semiconductor package is bonded using a solder under a board of the second semiconductor package.

8. The semiconductor package according to claim 1, wherein the first plated layer is formed by stacking two or more layers using at least one of Cu, Ni, Au, and a conductive material.

* * * * *